United States Patent
Tabata et al.

(10) Patent No.: US 8,330,248 B2
(45) Date of Patent: Dec. 11, 2012

(54) SEMICONDUCTOR DEVICE, MASK FOR FABRICATION OF SEMICONDUCTOR DEVICE, AND OPTICAL PROXIMITY CORRECTION METHOD

(75) Inventors: Yasuko Tabata, Shiga (JP); Akio Misaka, Osaka (JP); Takehiro Hirai, Shiga (JP); Hideyuki Arai, Toyama (JP); Yuji Nonami, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/014,346

(22) Filed: Jan. 26, 2011

(65) Prior Publication Data
US 2011/0278679 A1  Nov. 17, 2011

(30) Foreign Application Priority Data
May 17, 2010  (JP) ................................. 2010-112991

(51) Int. Cl.
*H01L 31/23* (2006.01)
(52) U.S. Cl. ........................................ 257/528; 257/401
(58) Field of Classification Search ............... 257/528, 257/401, E21.621; 430/5; 716/53
See application file for complete search history.

(56) References Cited

U.S. PATENT DOCUMENTS

| | | | |
|---|---|---|---|
| 6,871,338 B2 * | 3/2005 | Yamauchi | ........................ 716/52 |
| 7,014,955 B2 * | 3/2006 | Chang et al. | ........................ 430/5 |
| 7,174,532 B2 * | 2/2007 | Chlipala et al. | ................. 716/53 |
| 7,701,034 B2 * | 4/2010 | Chuang et al. | ................ 257/508 |
| 7,739,648 B2 * | 6/2010 | Kumar et al. | .................... 716/53 |
| 2005/0093165 A1 | 5/2005 | Morita | |
| 2008/0265425 A1 | 10/2008 | Lee et al. | |
| 2009/0044164 A1 | 2/2009 | Lee | |

FOREIGN PATENT DOCUMENTS

| | | |
|---|---|---|
| JP | 09-311432 | 12/1997 |
| JP | 2003-114515 | 4/2003 |
| JP | 2005-136135 | 5/2005 |
| WO | WO 2006/118098 A1 | 11/2006 |

\* cited by examiner

*Primary Examiner* — Howard Weiss
*Assistant Examiner* — Steven Rao
(74) *Attorney, Agent, or Firm* — McDermott Will & Emery LLP

(57) ABSTRACT

A semiconductor device includes a circuit portion including at least one real feature, and a plurality of dummy feature groups each including a plurality of dummy features spaced apart from each other by a first distance. The plurality of dummy feature groups are spaced apart from each other by a second distance larger than the first distance, and the circuit portion and the plurality of dummy feature groups are spaced apart from each other by the second distance.

20 Claims, 8 Drawing Sheets

SEMICONDUCTOR DEVICE, MASK FOR FABRICATION OF SEMICONDUCTOR DEVICE, AND OPTICAL PROXIMITY CORRECTION METHOD

CROSS-REFERENCE TO RELATED APPLICATION

This application claims priority to Japanese Patent Application No. 2010-112991 filed on May 17, 2010, the disclosure of which including the specification, the drawings, and the claims is hereby incorporated by reference in its entirety.

BACKGROUND

In the fabrication of semiconductor devices, a mask is drawn after the design layout thereof is modified by optical proximity correction (OPC), which is a technique of predicting distortions due to the optical proximity effect and compensating for the distortions. Design features are transferred to a wafer by exposure using the drawn mask. Note that the OPC-corrected layout may be directly drawn on a wafer without using a mask.

OPC is intended to correct distortions which are caused not only in photolithography, but also in other processes, such as charged particle beam lithography, X-ray lithography, etching, chemical mechanical polishing (CMP), mask formation, etc.

In general, there is a trade-off between the accuracy of OPC and the manufacturing cost of a mask, a wafer, etc. In other words, more accurate OPC tends to result in higher cost.

Conventionally, as a technique of the OPC process, rule-based OPC has been mainly used. In rule-based OPC, correction rules are described by a human based on geometric elements which are those that are handled by a design rule checker (DRC). Also, the unit of a correction step, the subdivision level of a target to be corrected, the correction level of a corner portion, the correction level of a line end portion, etc. are parameters for improving accuracy. As the accuracies of these parameters are increased, the OPC processing time and the mask manufacturing cost increase.

In recent years, model-based OPC has been employed instead of rule-based OPC. In model-based OPC, correction is performed while predicting features formed on a wafer using lithography simulation. Therefore, more accurate correction can be achieved, but a longer processing time is required because the simulation is performed at the chip level. For example, when conventional process resources are used, several days or weeks may be required. The unit length in the length direction of an edge to be moved, the number of the units, the step of movement, etc. are parameters for improving accuracy. As the accuracies of these parameters are increased, the number of portions of data to be drawn as well as resources required for the OPC process tends to increase, resulting in an increase in the mask manufacturing cost.

In general, model-based OPC produces an OPC-corrected layout having a more complicated feature than that of rule-based OPC, and therefore, the amount of out data increases. Therefore, it takes a longer time to convert the OPC-corrected layout into mask data and draw the mask on a wafer.

As described above, in both rule-based OPC and model-based OPC, as the accuracy of the OPC process is increased, the OPC processing time and the mask manufacturing cost increase.

On the other hand, as microfabrication technology has been advanced, there has been a demand for a feature area per unit area and a feature circumferential length which are limited to predetermined ranges in order to ensure the process dimension accuracy and the flatness of lithography, dry etching, CMP, etc. For example, in the case of the step of forming a gate electrode of a transistor, this is achieved by providing, in addition to the gate electrode of the transistor, a dummy feature which is not directly involved in the operation of the transistor. Such a dummy feature needs to be modified using the OPC process in terms of ensuring the process dimension accuracy and the flatness, and therefore, the OPC processing time and the mask manufacturing cost further increase.

In this situation, International Publication No. WO 2006/118098 describes a technique of separating, in features laid out throughout a semiconductor chip, blocks in which the OPC process is performed with high accuracy (e.g., blocks including transistors etc. which actually operate as a circuit) and blocks in which the OPC process is performed with low accuracy (blocks in which variations in feature formation have less influence on circuit operation (e.g., a dummy feature)). When the high-accuracy OPC process is performed, the finished feature formed on the wafer has a high accuracy. However, the number of geometric elements calculated in the OPC process and the number of geometric elements formed in the OPC process are several times or dozens of times as large as when the low-accuracy process is performed. Therefore, by reducing to the extent possible the blocks in which the high-accuracy OPC process is performed, the OPC processing time and the mask manufacturing cost are reduced.

Japanese Patent Publication No. 2003-114515 describes a technique of using a dummy feature in order to reduce or prevent variations in dimensions in a circuit feature depending on the layout of a mask feature. In particular, the dummy features are arranged so that the feature footprint ratio and the feature circumferential length per unit area meet standards.

Japanese Patent Publication No. H09-311432 describes a dummy feature having substantially the same line width as a representative line width of an original feature for configuring a circuit etc. As a result, substantially a uniform feature density can be achieved, thereby making it possible to reduce or prevent variations in dimensions due to a non-uniform feature density.

SUMMARY

As microfabrication technology has been advanced, however, problems with processing accuracy, such as variations in process dimensions due to the microloading effect of dry etching, have become more significant. To reduce or prevent this, it is necessary to limit the feature area per unit area and the feature circumferential length to predetermined ranges. It is also necessary to provide a dummy feature in an entire region other than a circuit portion including a real feature involved in the operation of transistors etc., and cause the dummy feature to have a dimension and a pitch close to those of the real feature.

In other words, the dummy feature also needs to have design rules similar to those of the real feature and be modified using OPC having a high accuracy similar to that for the real feature. This means that the high-accuracy OPC process is required for the entire chip, and therefore, the OPC processing time and the mask manufacturing cost increase. Moreover, because the dummy feature has a dimension similar to that of the real feature, the risk of defects, such as feature collapse etc., increases in the lithography step, the etching step, etc.

The present disclosure describes implementations of a semiconductor device, a mask for fabricating the semiconductor device, and an optical proximity correction method in which the processing accuracy of a fine and large dummy feature can be maintained to reduce or prevent variations in characteristics, and the processing time of OPC can be reduced.

An example semiconductor device of the present disclosure includes a circuit portion including at least one real feature, and a plurality of dummy feature groups each including a plurality of dummy features spaced apart from each other by a first distance. The plurality of dummy feature groups are spaced apart from each other by a second distance larger than the first distance, and the circuit portion and the plurality of dummy feature groups are spaced apart from each other by the second distance.

According to such a semiconductor device, a high-accuracy OPC process can be quickly performed during designing as described below.

Note that the first distance may be a distance for which optical proximity correction is required, and the second distance may be a distance for which optical proximity correction is not required.

Such a setting can be obtained by causing the second distance to be larger than the first distance.

In the semiconductor device of the present disclosure, the circuit portion including the real feature (a transistor etc.), which is involved in the operation of a semiconductor device, and the dummy feature groups including the dummy features, which are not involved in the operation of the semiconductor device, are spaced apart from each other by a sufficient distance which is larger than the distance for which OPC is required. Therefore, the OPC process does not need to be simultaneously applied to the features on the entire semiconductor device, and may be applied to the circuit portion and the dummy feature groups separately. In addition, as the dummy feature group, an OPC-corrected feature previously prepared can be used. Therefore, when semiconductor devices are designed, the OPC process needs to be applied only to the circuit portion of each device.

Thus, geometric elements to be subjected to the OPC process can be significantly reduced. Therefore, even when a high-accuracy OPC process is performed, the OPC processing time can be significantly reduced. Also, by providing, around a circuit portion, fine dummy feature groups to which a high-accuracy OPC process is previously applied, the feature area ratio, the feature circumferential length ratio, etc. can be adjusted, whereby variations in feature in the circuit portion involved in operation can be reduced. Thus, a semiconductor device can be provided in which variations in characteristics can be reduced and which can be quickly designed.

Note that the second distance may be larger than or equal to a light source wavelength/a lens numerical aperture of a device for exposing the plurality of dummy feature groups.

In this case, it is further ensured that OPC is not required between the dummy feature groups and between the dummy feature group and the circuit portion, and therefore, a semiconductor device having features which are more accurately formed can be provided.

The at least one real feature may include a gate electrode. The plurality of dummy feature groups may include a plurality of the dummy features which have a linear shape and extend in parallel with each other.

Such dummy feature groups can be used in a semiconductor device in which a circuit portion including a transistor etc. is formed.

Of the plurality of dummy features extending in parallel with each other, an outermost dummy feature or features may have a width larger than that of an inner dummy feature or features.

In a dummy feature located at an outer peripheral portion of the dummy feature group, a defective feature, such as collapse, peeling, etc., is likely to occur due to, for example, the influence of variations in dimension during fabrication (e.g., a lithography step, a dry etching step). In this case, by causing the width of such a dummy feature to be larger than the width of an inner dummy feature, the defective feature can be reduced or prevented.

The plurality of dummy feature groups may include the dummy features coupled to each other.

As a result, collapse, peeling, etc. of each dummy feature can be reduced or prevented.

The plurality of dummy feature groups may include an array of the dummy features arranged in at least two directions, each of the dummy features having a width and a length, where the ratio of the width to the length is 1:20 or less. An outer peripheral portion of the array may include the dummy feature or features having a width larger than that of the dummy feature or features located farther inside the array.

The plurality of dummy feature groups may include an array of the dummy features arranged in at least two directions, each of the dummy features having a width and a length, where the ratio of the width to the length is 1:20 or less. An outer peripheral portion of the array may include the dummy feature or features coupled to the dummy feature or features located farther inside the array.

In these cases, collapse etc. of a dummy feature located at the outer peripheral portion is reduced or prevented, whereby a defective feature can be reduced or prevented.

The at least one real feature may include a contact hole. The plurality of dummy feature groups may include the dummy feature or features in the shape of a hole.

In this case, the present disclosure is applicable to formation of a contact.

The plurality of dummy feature groups may be each in the shape of a square with a side of 4 μm or more and 10 μm or less.

The dummy feature group may have such a shape and size.

Next, an example mask for semiconductor fabrication of the present disclosure includes a circuit mask feature including at least one real mask feature, and a plurality of dummy mask feature groups each including a plurality of dummy mask features spaced apart from each other by a first distance. The plurality of dummy mask feature groups are spaced apart from each other by a second distance larger than the first distance, and the circuit mask portion and the plurality of dummy mask feature groups are spaced apart from each other by the second distance.

According to such a mask for semiconductor fabrication, as already described about the semiconductor device of the present disclosure, a high-accuracy OPC process can be quickly performed as described below. Specifically, a semiconductor device can be provided in which fine dummy features are provided to reduce variations in characteristics, and a high-accuracy OPC process is previously quickly applied.

Note that the first distance may be a distance for which optical proximity correction is required, and the second distance may be a distance for which optical proximity correction is not required.

Such a setting can be obtained by causing the second distance to be larger than the first distance.

The second distance may be, at least, larger than or equal to a reduction projection factor×a light source wavelength/a lens numerical aperture of a device for exposing the plurality of dummy mask feature groups.

In this case, it is further ensured that OPC is not required between the dummy feature groups to be transferred to a semiconductor device and between the dummy feature group and the circuit portion. Therefore, a mask for semiconductor fabrication with which features can be more accurately formed can be provided.

The at least one real mask feature may include a mask feature corresponding to a gate electrode. The plurality of dummy mask feature groups may include a plurality of the dummy mask features which have a linear shape and extend in parallel with each other.

In a mask for fabricating a semiconductor device in which a circuit portion including a transistor is formed, such dummy mask feature groups can be used.

Of the plurality of dummy mask features extending in parallel with each other, an outermost dummy mask feature or features may have a width larger than that of an inner dummy mask feature or features.

The plurality of dummy mask feature groups may include the dummy mask features coupled to each other.

The plurality of dummy mask feature groups may include an array of the dummy mask features arranged in at least two directions, each of the dummy mask features having a width and a length, where the ratio of the width to the length is 1:20 or less. An outer peripheral portion of the array may include the dummy mask feature or features having a width larger than that of the dummy mask feature or features located farther inside the array.

The plurality of dummy mask feature groups may include an array of the dummy mask features arranged in at least two directions, each of the dummy mask features having a width and a length, where the ratio of the width to the length is 1:20 or less. An outer peripheral portion of the array may include the dummy mask feature or features coupled to the dummy mask feature or features located farther inside the array.

Such dummy mask feature groups can be used to reduce or prevent a defective feature, such as collapse, peeling, etc. of a dummy feature transferred to a semiconductor device.

The at least one real mask feature may include a mask feature corresponding a contact hole. The plurality of dummy mask feature groups may include the dummy mask feature or features corresponding to a feature in the shape of a hole.

In this case, the present disclosure is applicable to formation of a contact hole.

The plurality of dummy mask feature groups may be each in the shape of a square with a side of 4 µm or more and 10 µm or less.

The dummy mask feature group may have such a shape and size.

Next, an example method for optical proximity correction of the present disclosure includes the steps of (a) forming a circuit layout corresponding to a circuit portion including at least one real feature, (b) applying optical proximity correction to the circuit portion, (c) preparing a dummy layout corresponding to a plurality of optical proximity corrected dummy feature groups each including a plurality of dummy features spaced apart from each other by a distance for which optical proximity correction is required, and (d) arranging at least one of the circuit layouts and a plurality of the dummy layouts. In step (d), the plurality of dummy feature groups are spaced apart from each other by a predetermined distance larger than the distance for which optical proximity correction is required, and the circuit portion and the plurality of dummy feature groups are spaced apart from each other by the predetermined distance.

According to the optical proximity correction method, a high-accuracy OPC process can be quickly performed.

Specifically, a circuit layout and a dummy layout are spaced apart from each other by a sufficient distance, and by using a dummy layout (layout corresponding to a dummy feature group) to which optical proximity correction is previously applied, when semiconductor devices are designed, the OPC process needs to be applied only to the circuit portion of each device. Therefore, compared to the case where the OPC process is simultaneously applied to the features on the entire semiconductor device, the time required for the OPC process can be significantly reduced even if the OPC process is highly accurately performed.

Note that the predetermined distance may be, at least, larger than or equal to a light source wavelength/a lens numerical aperture of a device for exposing the plurality of dummy feature groups.

In this case, it is further ensured that OPC is not required between the dummy feature groups and between the dummy feature group and the circuit portion, and therefore, a semiconductor device having features which are more accurately formed can be provided.

According to the semiconductor device, the semiconductor fabrication mask, and the optical proximity correction method of the present disclosure, the OPC process is applied to a circuit portion including a real feature which is involved in operation while using a fine dummy feature, whereby a high-accuracy OPC process can be quickly performed. Therefore, the variation in characteristics and the cost can be reduced.

DETAILED DESCRIPTION

First Embodiment

A first embodiment of the present disclosure will be described hereinafter with reference to the accompanying drawings.

Figure 1A:
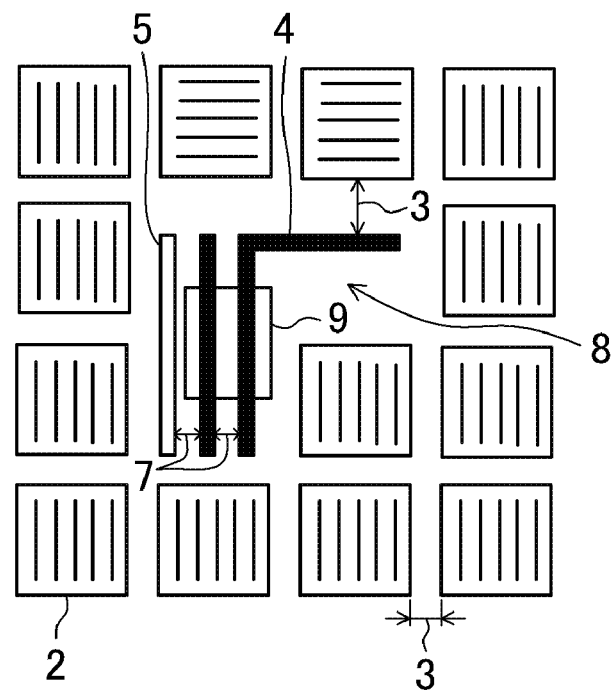
FIGS. 1A and 1B are diagrams showing an example layout according to a first embodiment of the present disclosure.
Figure 1B:
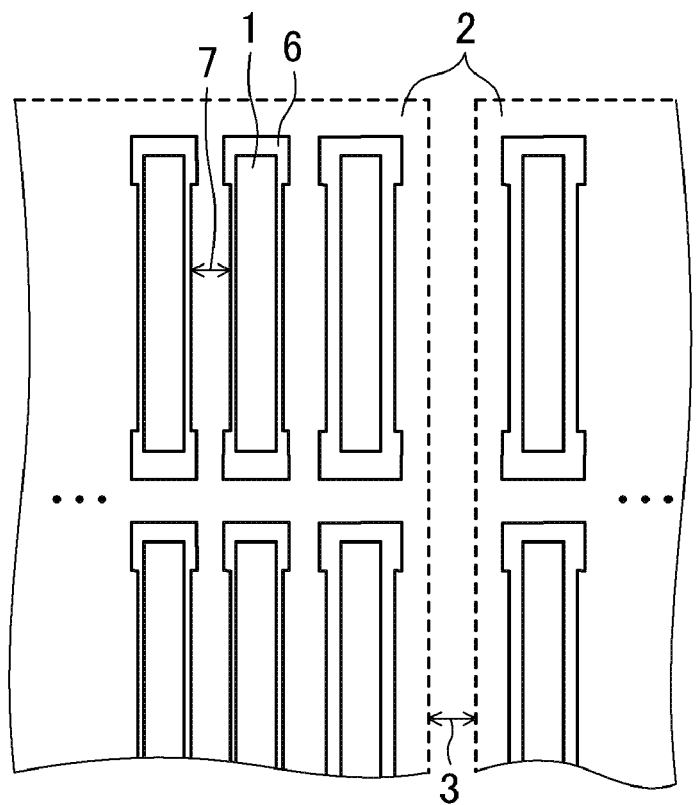

FIGS. 1A and 1B are diagrams showing a design layout of an example semiconductor device of this embodiment. A mask for semiconductor fabrication is produced based on such a design layout, and then used to fabricate a semiconductor device.

As shown in FIG. 1A, the semiconductor device includes a circuit portion 8 which is a main part of the device which is involved in the operation, and dummy cells 2 which are provided around the circuit portion 8 to adjust an area ratio, a circumferential length ratio, etc., thereby improving processing accuracy.

The circuit portion 8 has transistors including an active layer 9 and gate electrodes 4 provided on the active layer 9. Dummy gate electrodes 5 which have a feature substantially as fine as that of the gate electrodes 4 are provided in order to, for example, improve the processing accuracy of the gate electrodes 4. Here, the distance between the gate electrodes 4, the distance between the dummy gate electrodes 5, and the distance between the gate electrode 4 and the dummy gate electrode 5 are all smaller than a distance for which optical proximity correction is required (hereinafter these distances are referred to as an OPC-required distance 7). Therefore, although not shown in detail, the design data includes the result of optical proximity correction applied to the gate electrodes 4 and the dummy gate electrodes 5.

The distance between the circuit portion 8 and the dummy cell 2 and the distance between the dummy cells 2 are set to be sufficiently large so that optical proximity correction is substantially not required (hereinafter these distances are referred to as OPC-not-required distances 3). In other words, optical proximity correction can be applied to the circuit portion 8 and the dummy cell 2 individually and separately, and optical proximity correction is not required between the circuit portion 8 and the dummy cell 2 or between the dummy cells 2 (when optical proximity correction is applied to the circuit portion 8 or one dummy cell 2, no or no other dummy cell 2 needs to be taken into consideration).

Next, FIG. 1B shows the dummy cell 2 in greater detail. As described above, the dummy cells 2 are spaced apart from each other by the OPC-not-required distance 3. In each dummy cell 2, a plurality of dummy features 1 (dummy feature group) are provided. The distance between the dummy features 1 is the OPC-required distance 7. The design data includes OPC dummy features 6 which are obtained by previously applying optical proximity correction.

The dummy feature 1 preferably has a width which is substantially the same as or up to about three times as large as a width (dimension in the gate length direction) of the feature of the gate electrode 4 of the circuit portion 8. For example, in the case of the gate electrode 4 with design rules of 32 nm, the width of the dummy feature 1 is 32 nm or more and 96 nm or less. As a result, the features of the circuit portion 8 and the dummy cell 2 have a similar area ratio and circumferential length ratio in the entire chip or in a predetermined unit area in the chip.

The distance between the dummy features 1 (the OPC-required distance 7) is, for example, 160 nm or less, which is calculated from the wavelength of a light source/the numerical aperture of a lens, where a scanner having a light source wavelength of 193 nm and a lens numerical aperture of 1.2 is used. Note that the distance between the dummy features 1 is preferably substantially the same as the distance between the gate electrodes 4 in the circuit portion 8.

The distance between the dummy cells 2 and the distance between the dummy cell 2 and the circuit portion 8 (the OPC-not-required distance 3) (e.g., 200 nm) are larger than the light source wavelength/the lens numerical aperture (160 nm in the above example). Therefore, the distances between the dummy cell 2, and the gate electrode 4 and the dummy gate electrode 5 in the circuit portion 8, are also 160 nm or more.

Figure 2:
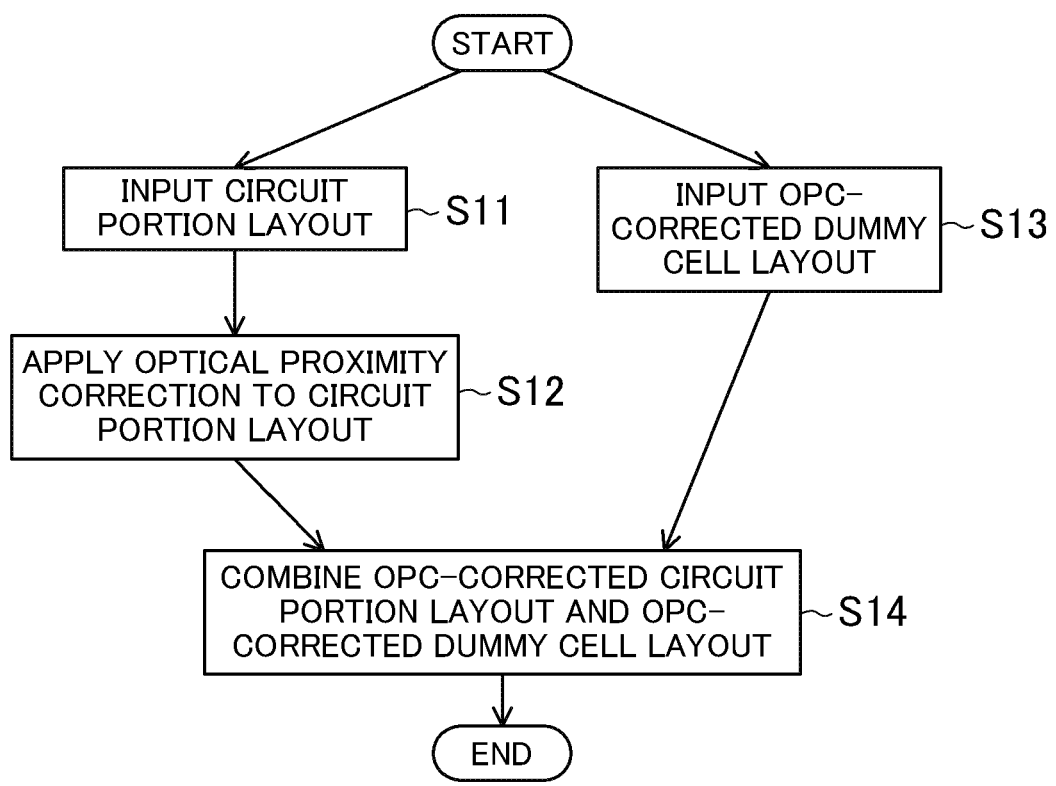
FIG. 2 is a diagram showing an example flow of an optical proximity correction process according to the first embodiment of the present disclosure.

Next, FIG. 2 shows an example flow of obtaining an OPC-corrected layout including the circuit portion 8 and the dummy cells 2 (a flow of an optical proximity correction method according to this embodiment). Such a flow is performed using, for example, a computer and a computer aided design (CAD) tool, an electronic design automation (EDA) tool, etc. In the description that follows, inputting layouts means inputting layouts into a computer etc.

To perform the flow of FIG. 2, initially, a circuit portion layout (e.g., the layout of a portion which is involved in the operation of a semiconductor device and includes the gate electrodes 4, the dummy gate electrodes 5, etc.) and a dummy cell layout (e.g., the layout of the dummy features 1 spaced apart from each other by the OPC-required distance 7) are prepared. Optical proximity correction is previously applied to the dummy cell layout to obtain an OPC-corrected dummy cell layout.

In the flow of FIG. 2, in step S11, the circuit portion layout is input. Next, in step S12, optical proximity correction is applied to the circuit portion layout to obtain an OPC-corrected circuit portion layout.

Independently of steps S11 and S12, in step S13, the OPC-corrected dummy cell layout is input.

Next, in step S14, the OPC-corrected circuit portion layout and the OPC-corrected dummy cell layout are combined. In this case, the OPC-corrected circuit portion layout and the OPC-corrected dummy cell layout are spaced apart from each other by the OPC-not-required distance 3 (e.g., 160 nm or more). As a result, an OPC-corrected layout including the circuit portion 8 and the dummy cells 2 can be obtained.

Because the dummy cells 2 and the circuit portion 8 are spaced apart from each other sufficiently (by the OPC-not-required distance 3), the OPC-corrected dummy cell layout can be previously prepared. Therefore, it is not necessary to newly apply the OPC process to dummy cells every time a semiconductor device is designed. In other words, once the OPC process is applied to dummy cells to obtain the OPC-corrected dummy cell layout, the OPC-corrected dummy cell layout can be reused for designing other semiconductor devices.

As a result, when the OPC process is applied to the layout of a semiconductor device, the OPC-corrected dummy cell layout may be used, and the OPC process is newly applied only to the circuit portion layout other than the dummy cell layout. Therefore, geometric elements which are subjected to the OPC process can be significantly reduced. As a result, even if a high-accuracy OPC process is performed, the time required for the OPC process can be significantly reduced.

In general, the time required for the OPC process exponentially increases with the amount of geometric elements to be processed. Therefore, by reducing geometric elements to be processed, the processing time can be significantly reduced. Assuming that, for example, the footprint ratio of the dummy cells 2 (the ratio of the number of features in which are provided in the dummy cells 2 to the number of all features) is 20% of the designed chip, and the processing time of the entire designed chip is 100 hours, the processing time can be reduced to 40 hours by using the method of this embodiment. It is considered that, in the future, further advances in microfabrication technology for semiconductor devices will increase the time required for the OPC process if no measures are taken. Therefore, the advantage of the method of this embodiment will become more significant.

As described above, by performing exposure with respect to features using a semiconductor manufacture mask produced by the method of this embodiment, a high-accuracy OPC process can be applied to the entire designed chip while reducing the OPC processing time and therefore the manufacturing cost, thereby reducing variations in characteristics.

Note that, in the above description, the OPC-not-required distance 3 is determined with reference to the light source wavelength/the lens numerical aperture of an exposure apparatus when the features are exposed to light. In addition to this, however, a difference in process dimension due to the microloading effect of dry etching, etc. may be taken into consideration.

Figure 9:
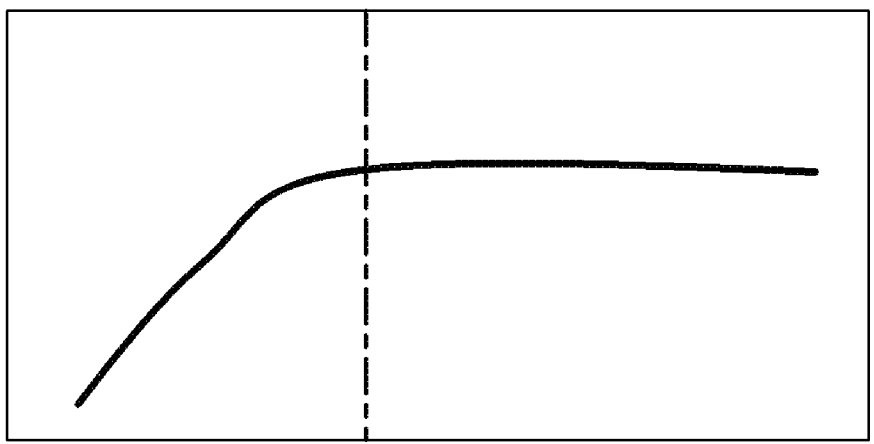
FIG. 9 is a diagram showing variations in conversion difference between a dimension after lithography and a dimension after dry etching, with respect to a feature interval.

The microloading effect is shown in a graph of FIG. 9. As shown in FIG. 9, a conversion difference between a dimension after lithography and a dimension after dry etching varies depending on the feature interval. When the feature interval is larger than or equal to a predetermined value, the conversion difference is constant. The predetermined value at which the conversion difference starts to be constant is, for example, 400 nm in the case of a CMOS process with design rules of 32 nm.

Although the design data of the dummy features 1 included in the dummy cell 2 has a rectangular shape before the OPC process (see FIG. 1B) in the above example, the present disclosure is not limited to this. The dummy features 1 may have other shapes.

Although the dummy cells 2 have the same single size in FIG. 1A, the present disclosure is not limited to this. A plurality of dummy cells 2 having different sizes may be prepared, where the size of the dummy cell 2 varies depending on a size of a region where the dummy cell 2 is provided.

Other Example Configurations of Dummy Cell

Next, other configurations of dummy features provided in the dummy cell 2 will be described.

FIG. 1B shows a dummy feature group in which the same linear dummy features 1 are arranged to extend in parallel with each other. The present disclosure is, however, not limited to this. Configurations described below may be used.

Figure 3A:
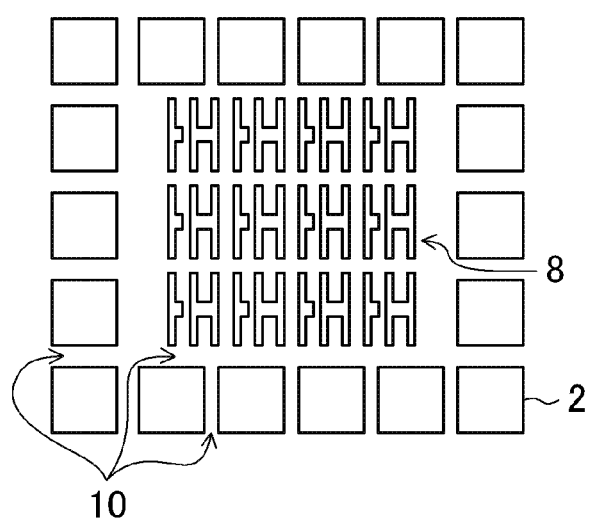
FIGS. 3A-3F are diagrams showing a dummy feature group included in a dummy cell in the first embodiment of the present disclosure.

FIG. 3A shows a circuit portion 8 which is involved in the operation of a semiconductor device, and dummy cells 2 which are provided around the circuit portion 8, are not involved in the operation, and are used to adjust the area ratio and the circumferential length ratio. A separation portion 10 is invariably provided between the circuit portion 8 and dummy cells 2 adjacent to the circuit portion 8 and between dummy cells 2 adjacent to each other. FIGS. 3B-3F show example configurations of a dummy feature group in the dummy cell 2.

Figure 3B:
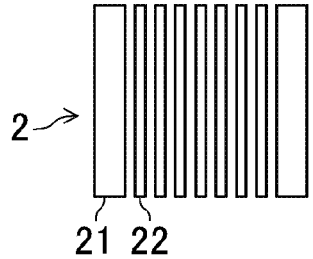

In the example of FIG. 3B, linear dummy features 21 and 22 having a length corresponding to the length of a side of the dummy cell 2 are arranged to extend in parallel with each other. Here, the dummy features 21 located at the opposite ends of the array is wider than the dummy features 22 located farther inside than the dummy features 21 (e.g., the width of the dummy feature 21 is 1.1 to 3 times as large as the width of the dummy feature 22).

Dummy features facing the separation portion 10 (see FIG. 3A) between the dummy cells or between the dummy cell 2 and the circuit portion 8 are likely to have a feature defect, such as collapse, peeling, etc., due to variations in process. Examples of the variations in process include variations in exposure energy of an exposure apparatus in lithography, variations in chip height, variations in dimension due to deviation from focus of a lens, etc. Therefore, by causing the dummy feature 21 facing the separation portion 10 to be wider than the inner dummy feature 22, a defective feature can be reduced or prevented.

Note that the dummy cell 2 is, for example, in the shape of a square with a side of 4-10 µm. As a result, in the configuration of FIG. 3A, the dummy features 21 and 22 have a length of 4-10 µm. The width of the dummy feature 22 is preferably 1-3 times as large as the dimension of the gate electrode 4, specifically, 32 nm or more and 96 nm or less in the case of the gate electrode 4 with design rules of 32 nm. The dummy features 21 and 22 are spaced apart from each other by the OPC-required distance 7 (e.g., 160 µm or less).

Figure 3C:
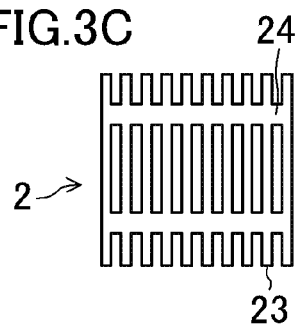

Next, in the example of FIG. 3C, dummy features 23 having the same width are arranged to extend in parallel with each other and are coupled with each other at one or more coupling portions 24. The width, length, spacing, etc. of the dummy features 23 are similar to those of the example of FIG. 3B.

In this case, the feature has a larger area due to the coupling, and therefore, a defective feature due to feature collapse etc. in the dry etching step, the CMP step, etc. can be reduced or prevented.

Figure 3D:
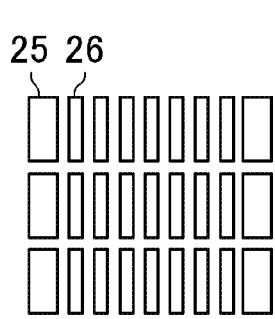

Next, in the example of FIG. 3D, dummy features 25 and 26 are arranged in two directions (here, the two directions intersect at right angles) to form a dummy feature group. The dummy features 25 and 26 are each in the shape of a quadrangle (rectangle). The dimension relationship between the short side and the long side (the ratio of the width to the length) is 1:20 or less. The dummy feature 25 whose long side faces the separation portion 10 is wider than the dummy feature 26 located farther inside than the dummy feature 25 (e.g., the width of the dummy feature 25 is 1.1-3 times as large as the width of the dummy feature 25).

If the dummy feature is in the shape of a rectangle, the area ratio and the circumferential length ratio can be simultaneously finely adjusted.

As is different from the case of FIG. 3B etc., the dummy features are shorter than one side of the dummy cell 2, and therefore, the area of the features is smaller. As a result, resist feature collapse due to, for example, the impregnation of a developer in the lithography step can be reduced or avoided, and therefore, a margin for error in processing can be improved.

Specifically, in the case of the line-and-space pattern in which features are arranged to extend in parallel with each other, as the feature interval decreases, the resist feature is more likely to collapse due to the influence of the surface tension of a developer entering the gap between the resist features when the developer is removed. In this case, by reducing the length of the features extending in parallel with each other, the influence of the surface tension of the developer can be reduced, whereby a margin for error in processing the resist feature can be improved.

Note that, as in the example of FIG. 3B, a defective feature, such as collapse, peeling, etc., due to variations in process tends to occur in a portion facing the separation portion 10. Therefore, the width of the dummy feature 25 located at the outer peripheral portion facing the separation portion 10 is increased, thereby reducing or preventing the defective feature.

Note that, because the defective feature is likely to occur in a dummy feature whose long side faces the separation portion 10, the width of such a dummy feature is preferably increased. Note that the width of a dummy feature whose short side faces the separation portion 10 may also be increased.

Figure 3E:
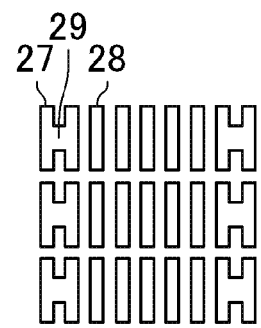

Next, in the example of FIG. 3E, dummy features 27 having the same width are arranged in two directions. As in the example of FIG. 3D, each dummy feature 27 is in the shape of a rectangle, where the relationship between the short side and the long side is 1:20 or less. As a result, resist feature collapse due to, for example, the impregnation of the developer in the lithography step can be reduced or avoided.

Moreover, the dummy feature 27 whose long side faces the separation portion 10 is coupled with an inner dummy feature 28 via a coupling portion 29. Therefore, in the dummy features 27 located at the outer peripheral portion, a defective feature due to variations in process as described above can be reduced or prevented.

Figure 3F:
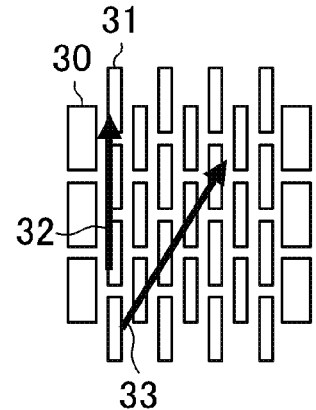

Next, in the example of FIG. 3F, dummy features 30 and 31 are arranged in a diagonal direction. Specifically, in the examples of FIGS. 3D and 3E, dummy features are arranged in two directions: the length direction of the dummy features; and a direction perpendicular to the length direction. In the example of FIG. 3F, the dummy features 30 and 31 are arranged in two directions: the length direction 32 of the dummy features 30 or 31; and a diagonal direction 33 which is not perpendicular to the length direction 32. For example, one dummy feature 31 is translated (deviated) from another dummy feature 31 or 30 adjacent to and extending in parallel with that dummy feature 31, in the length direction 32 by half of the length of the dummy feature 31.

In this case, a portion of one dummy feature is adjacent to a gap between other dummy features arranged side by side in the length direction 32. Therefore, the distance along which adjacent dummy features extend in parallel with each other densely (without a gap) is reduced. As a result, a bridge due to imperfect development in lithography (a defect that developed dummy features which should be separated are linked to each other) tends to be avoided, whereby a margin for error in processing can be improved.

Note that, as in the example of FIG. 3B, a defective feature, such as collapse, peeling, etc., due to variations in process tends to occur in a portion facing the separation portion 10. Therefore, the width of the dummy feature 25 located at the outer peripheral portion facing the separation portion 10 is increased, thereby reducing or preventing the defective feature.

Note that, as in the example of FIG. 3D, each dummy feature is in the shape of a rectangle, where the relationship between the short side and the long side is 1:20 or less.

Note that the above examples all show features before the OPC process. The OPC process is previously applied to these features to prepare an OPC-corrected dummy cell layout which is design data including optical proximity corrected features. Thereafter, a mask for semiconductor fabrication is produced based on the OPC-corrected dummy cell layout. A semiconductor device is fabricated using the mask.

Other Example Flows of Optical Proximity Correction Method

Next, other example flows of obtaining an optical proximity corrected layout including the circuit portion 8 and the dummy cells 2 (a flow of the optical proximity correction method) will be described. In each example described below, it is assumed that a circuit portion layout, a dummy cell layout, and an OPC-corrected dummy cell layout are previously prepared. Also, here, inputting a layout etc. using an EDA tool etc. means inputting a layout into a computer.

Figure 4:
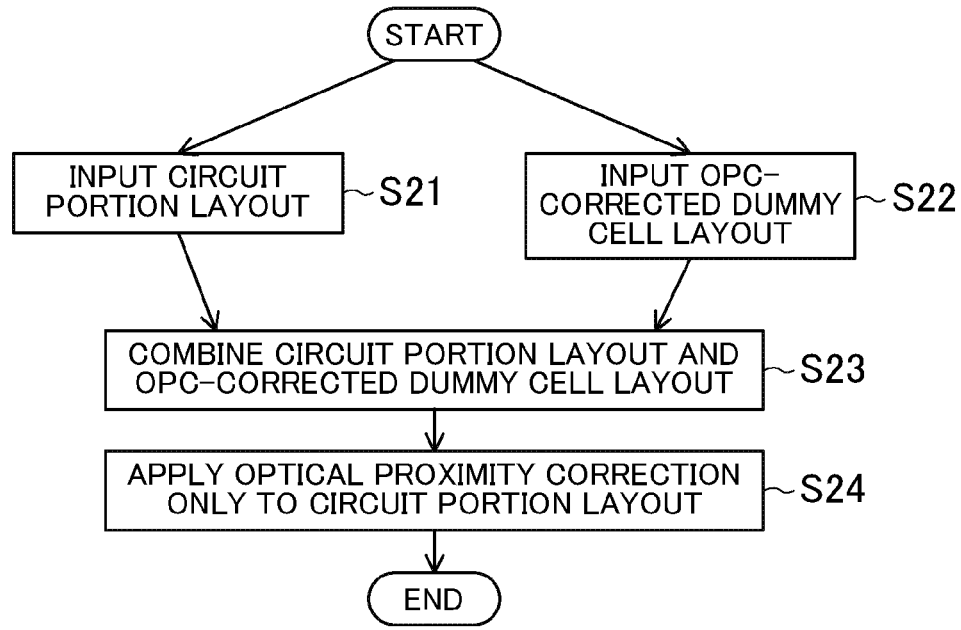
FIG. 4 is a diagram showing another example flow of the optical proximity correction process of the first embodiment of the present disclosure.

In a flow shown in FIG. 4, in step S21, a circuit portion layout is input. Independently of step S21, in step S22, an OPC-corrected dummy cell layout is input.

Next, in step S23, the circuit portion layout and the OPC-corrected dummy cell layout are combined. In this case, the circuit portion layout and the OPC-corrected dummy cell layout are spaced apart from each other by the OPC-not-required distance 3.

Next, in step S24, optical proximity correction is applied only to the circuit portion layout.

Thus, an optical proximity corrected layout including a circuit portion and dummy cells can be obtained. By using the OPC-corrected dummy cell layout for dummy cells, the OPC process may be applied only to the circuit portion layout which is involved in operation when a semiconductor device is designed. Because the circuit portion and the dummy cells are spaced apart from each other by the OPC-not-required distance 3, such a method can apply a high-accuracy OPC process to the circuit portion. Therefore, a high-accuracy OPC process can be quickly applied to the entire chip.

Figure 5:
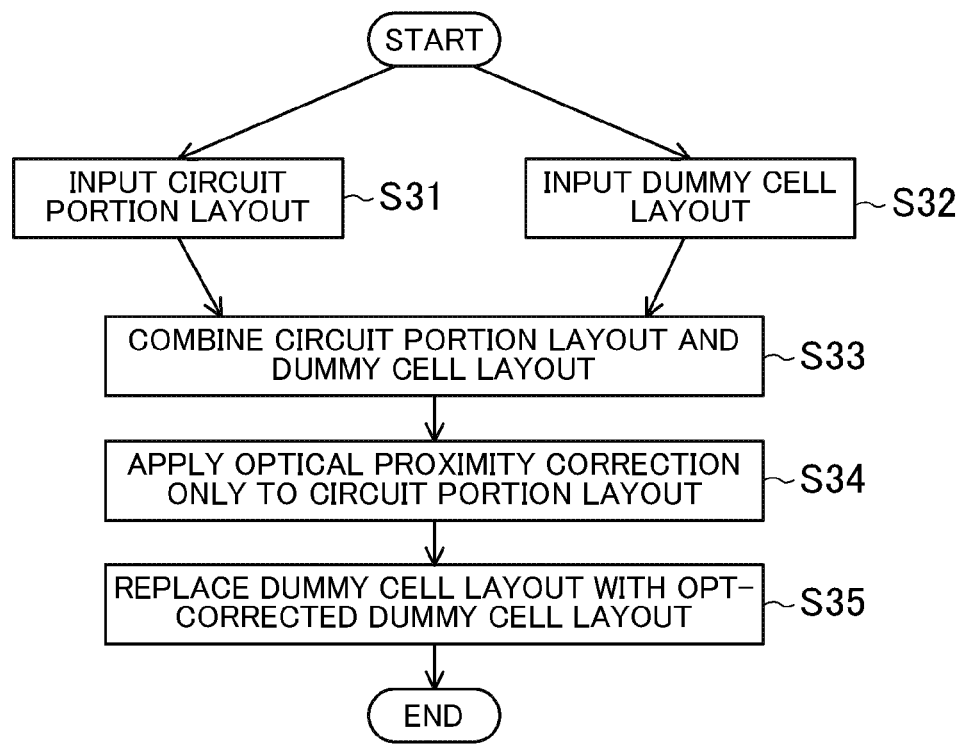
FIG. 5 is a diagram showing still another example flow of the optical proximity correction process of the first embodiment of the present disclosure.

Next, in a flow shown in FIG. 5, in step S31, a circuit portion layout is input. Independently of step S31, in step S32, a dummy cell layout (a layout before the OPC process is applied) is input.

Next, in step S33, the circuit portion layout and the dummy cell layout are combined. In this case, the circuit portion layout and the dummy cell layout are spaced apart from each other by the OPC-not-required distance 3.

Next, in step S34, optical proximity correction is applied only to the circuit portion layout. Next, in step S35, the dummy cell layout is replaced with the OPC-corrected dummy cell layout.

Thus, an optical proximity corrected layout including a circuit portion and dummy cells can be obtained. By using the OPC-corrected dummy cell layout, the OPC process may be applied only to the circuit portion layout. Therefore, a high-accuracy OPC process can be quickly applied to the entire chip.

Second Embodiment

A second embodiment of the present disclosure will be described hereinafter with reference to the drawings.

Figure 6A:
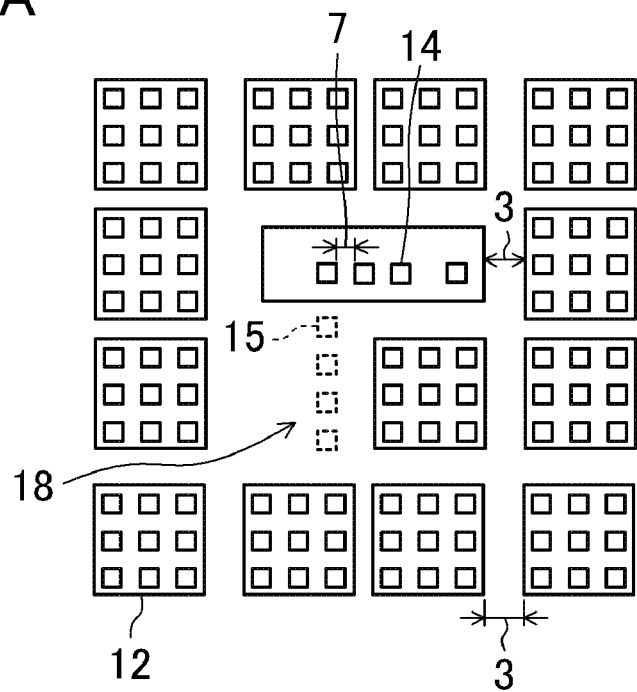
FIGS. 6A and 6B are diagrams showing an example layout according to a second embodiment of the present disclosure.
Figure 6B:
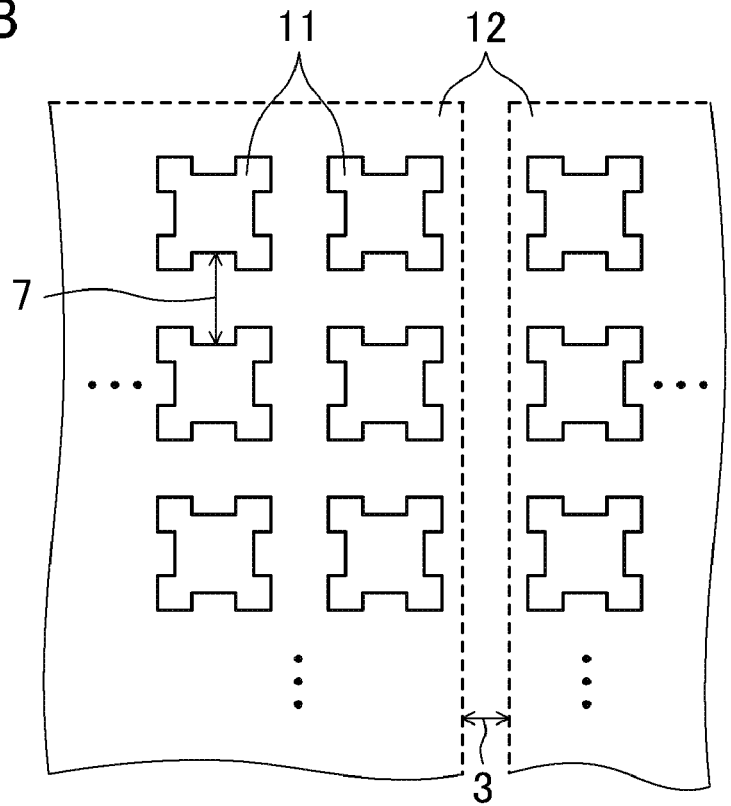

FIGS. 6A and 6B are diagrams showing a design layout of an example semiconductor device according to this embodiment.

As shown in FIG. 6A, the semiconductor device includes a circuit portion 18, and dummy cells 12 which are provided around the circuit portion 18 to adjust an area ratio, a circumferential length ratio, etc.

The circuit portion 18 includes contacts 14 which are actually involved in operation, and dummy contacts 15 which are not involved in operation. The dummy contacts 15 are provided to, for example, improve the processing accuracy of the contacts 14, and have a feature substantially as fine as that of the contacts 14. Here, the distance between the contacts 14, the distance between the dummy contacts 15, and the distance between the contact 14 and the dummy contact 15 are all the OPC-required distance 7. In other words, the contacts 14 and the dummy contacts 15 are so close to each other that optical proximity correction needs to be applied thereto. Therefore, although not shown in detail, the design data includes the result of optical proximity correction applied to the contacts 14 and the dummy contacts 15.

The distance between the circuit portion 18 and the dummy cell 12 and the distance between the dummy cells 12 are all the OPC-not-required distance 3. In other words, the circuit portion 18 and the dummy cells 12 are so distant from each other that optical proximity correction does not need to be applied thereto. Therefore, optical proximity correction can be applied to the circuit portion 18 and the dummy cells 12 individually and separately, and optical proximity correction is not required between the circuit portion 18 and the dummy cell 12 or between the dummy cells 12 (when optical proximity correction is applied to the circuit portion 18 or one dummy cell 12, no or no other dummy cell 12 needs to be taken into consideration).

Next, FIG. 6B shows the dummy cells 12 in greater detail. As described above, the dummy cells 12 are spaced apart from each other by the OPC-not-required distance 3. In each dummy cell 12, a plurality of dummy features 11 (dummy feature group) are provided as contact features. The distance between the dummy features 11 is the OPC-required distance 7. Therefore, optical proximity correction is previously applied to each dummy feature 11 (i.e., the dummy feature 11 is an OPC-corrected feature).

For example, in the case of a CMOS process with design rules of 32 nm, the contact 14 has a dimension of about 50-60 nm. The dummy contact 15 has a dimension which is substantially the same as or up to about twice as large as the that of the contact 14, i.e., about 50-100 nm.

Here, the OPC-required distance 7 is, for example, 160 nm or less. The OPC-not-required distance 3 is, for example, 160 nm or more. Note that, as in the first embodiment, the OPC-required distance 7 and the OPC-not-required distance 3 are determined with reference to the light source wavelength/the lens numerical aperture of an exposure apparatus which exposes a feature to light.

A flow of obtaining an optical proximity corrected layout including the circuit portion 18 and the dummy cells 12 (a flow of a optical proximity correction method according to this embodiment) is similar to that of the first embodiment.

Specifically, a circuit portion layout (a layout of the circuit portion 18 including the contacts 14, the dummy contacts 15, etc.) and a dummy cell layout (a layout of the dummy cells 12 including the dummy features 11) are prepared. Optical proximity correction is previously applied to the dummy cell layout to obtain an OPC-corrected dummy cell layout.

Thereafter, for example, by a flow as shown in FIGS. 2, 4, and 5, an optical proximity corrected layout including the circuit portion 18 and the dummy cells 12 can be obtained.

Also in this embodiment, because the dummy cells 12 and the circuit portion 18 are spaced apart from each other sufficiently (by the OPC-not-required distance 3), the OPC-corrected dummy cell layout can be previously prepared. Therefore, it is not necessary to newly apply the OPC process to dummy cells every time a semiconductor device is designed. As a result, when the OPC process is applied to the layout of a semiconductor device, the OPC-corrected dummy cell layout may be used, and the OPC process is newly applied only to the circuit portion layout other than the dummy cell layout. Therefore, geometric elements which are subjected to the OPC process can be significantly reduced. As a result, even if a high-accuracy OPC process is performed, the time required for the OPC process can be significantly reduced.

In general, the time required for the OPC process exponentially increases with the amount of geometric elements to be processed. Assuming that, for example, the footprint ratio of the dummy cells 12 is 20% of the designed chip, and the processing time of the entire designed chip is 100 hours, the processing time can be reduced to 40 hours by using the method of this embodiment. It is considered that, in the future, further advances in microfabrication technology for semiconductor devices will increase the time required for the OPC process if no measures are taken. Therefore, the advantage of the method of this embodiment will become more significant.

As described above, by performing exposure with respect to features using a semiconductor manufacture mask produced by the method of this embodiment, a high-accuracy OPC process can be applied to the entire designed chip while reducing the OPC processing time and therefore the manufacturing cost, resulting in a reduction in variations in characteristics.

Note that, in the above description, the OPC-not-required distance 3 is larger than or equal to the light source wavelength/the lens numerical aperture of an exposure apparatus when the features are exposed to light. In addition to this, however, a difference in process dimension due to the microloading effect of dry etching, etc. may be taken into consideration.

Although the dummy features 11 included in the dummy cell 12 have a square shape in the design data before the OPC process in the above example, the present disclosure is not limited to this. The dummy features 11 (dummy feature group) may be in other shapes, such as a rectangle, a polygon, a circle, etc.

Although the dummy cells 12 have the same single size in FIG. 6A, the present disclosure is not limited to this. A plurality of dummy cells 12 having different sizes may be prepared, where the size of the dummy cell 12 varies depending on a size of a region where the dummy cell 12 is provided.

Method for Fabricating Semiconductor Device

Next, a method for fabricating a semiconductor device including the gate electrode of the first embodiment and the contact of the second embodiment will be described with reference to FIGS. 7A-7F and 8A-8H schematically showing steps of the method. Here, as an example, a semiconductor device including a high-k gate insulating film (an insulating film having a higher relative permittivity than that (about four) of a silicon oxide film) and a metal gate is assumed.

Firstly, a process of forming a gate electrode portion will be described with reference to FIGS. 7A-7F.

Figures 7A, 7B, 7C:
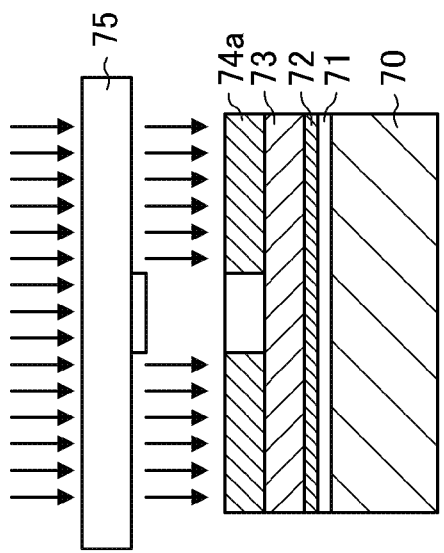
FIGS. 7A-7F are diagrams for describing steps of fabricating a semiconductor device of the present disclosure.

Initially, in a step shown in FIG. 7A, a gate insulating film 71, a metal film 72, and a polysilicon film 73 are successively formed and stacked in this stated order on the substrate 70. The gate insulating film 71 is, for example, a high-k film etc., and serves as a gate insulating film for a transistor. The metal film 72 is made of, for example, a compound of Ti etc. A multilayer structure of the polysilicon film 73 and the metal film 72 serves as a gate electrode.

Next, as shown in FIG. 7B, a resist film 74 is formed on the polysilicon film 73. Next, as shown in FIG. 7C, a mask 75 having a feature for a desired gate electrode portion is used to expose a predetermined portion of the resist film 74 to light, thereby forming a light-exposed portion 74a. Thereafter, a development step (e.g., dipping into a developer, etc.) is performed to obtain a desired resist feature 74b shown in FIG. 7D.

Thereafter, etching is performed using the resist feature 74b as a mask. After the etching, the resist feature 74b which is no longer required is removed.

Figures 7D, 7E, 7F:
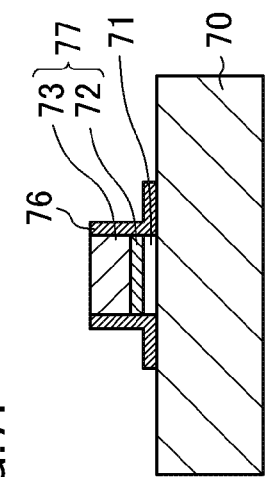

As a result, as shown in FIG. 7E, a gate electrode portion 77 including a multilayer structure of the metal film 72 and the polysilicon film 73 and having a desired feature dimension is formed on the substrate 70 with the gate insulating film 71 being interposed therebetween.

Next, as shown in FIG. 7F, a sidewall 76 is formed. The sidewall 76 serves as a mask when impurity implantation is performed in order to reduce electric field between the source and the drain of a typical MOS transistor. The sidewall 76 also serves as an insulating film which protects the gate electrode portion 77 from etching when a contact hole is formed in the vicinity of the gate electrode portion 77.

Note that the gate electrode portion 77 may be considered as any of the gate electrode 4, the dummy gate electrode 5, and the dummy feature 1 of FIGS. 1A and 1B. The gate electrode 4 which is actually involved in the operation of a semiconductor device is provided in a source/drain region etc. by ion implantation etc., and serves as a part of a transistor.

Next, a process of forming a contact will be described with reference to FIGS. 8A-8H.

Figure 8A:
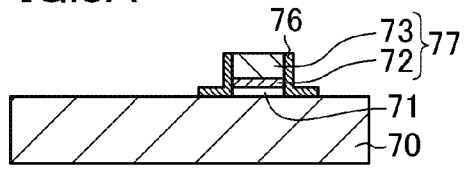
FIGS. 8A-8H are diagrams for describing steps of fabricating a semiconductor device of the present disclosure following the step of FIG. 7F.

FIG. 8A shows, as in FIG. 7F, the gate electrode portion 77 (including the metal film 72 and the polysilicon film 73) formed on the substrate 70 with the gate insulating film 71 being interposed therebetween, and the sidewall 76 covering a side surface of the gate electrode portion 77.

Figure 8E:
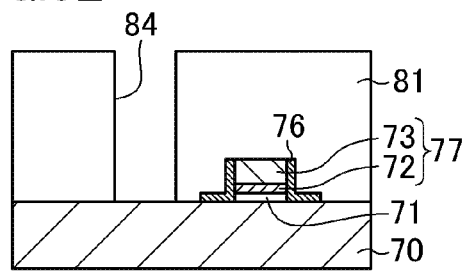
Figure 8B:
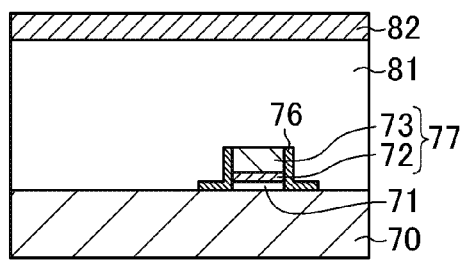

Next, a step shown in FIG. 8B is performed. Here, an interlayer insulating film 81 is formed on the substrate 70 by CVD etc. to cover the gate electrode portion 77 etc. Moreover, a resist film 82 is formed on the interlayer insulating film 81.

Figure 8F:
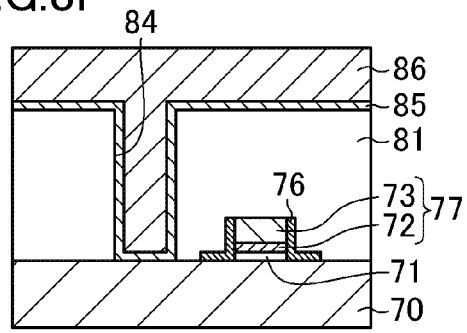
Figure 8C:
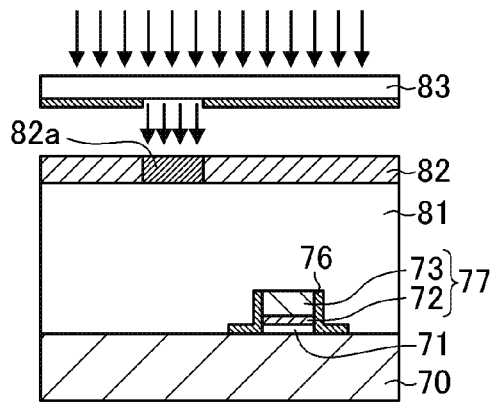

Next, as shown in FIG. 8C, a mask 83 having a desired contact feature is used to expose a predetermined portion of the resist film 82 to light, thereby forming a light-exposed portion 82a. Thereafter, a development step (e.g., dipping into a developer, etc.) is performed to obtain a resist feature 82b having a desired hole feature shown in FIG. 8D.

Next, the resist film 82b is used as a mask to perform selective etching with respect to the interlayer insulating film 81, and thereafter, the resist film 82b which is no longer required is removed. As a result, as shown in FIG. 8E, a contact hole 84 which reaches the substrate 70 is formed in the interlayer insulating film 81.

Figure 8G:
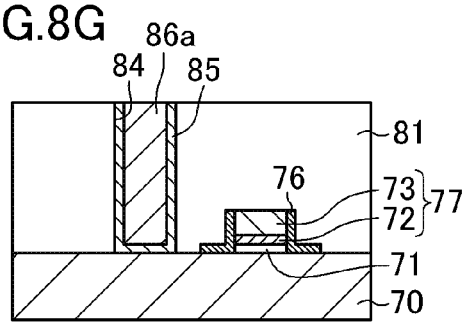
Figure 8D:
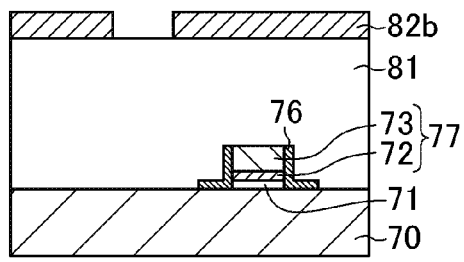

Next, as shown in FIG. 8F, a barrier metal 85 is formed inside the contact hole 84, and thereafter, the contact hole 84 is filled with a filling material, such as a tungsten film 86 etc. Moreover, as shown in FIG. 8G, the barrier metal 85 and the tungsten film 86 protruding outside the contact hole 84 are removed by CMP, whereby a contact plug 86a made of tungsten is formed in the contact hole 84 with the barrier metal 85 being interposed therebetween.

Figure 8H:
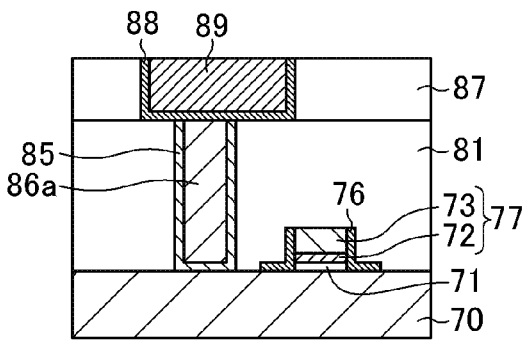

Thereafter, as shown in FIG. 8H, an interlayer insulating film 87 is formed to cover the interlayer insulating film 81 and the contact plug 86a by CVD etc. Moreover, an opening through which the contact plug 86a is exposed is formed in the interlayer insulating film 87, and thereafter, the opening is filled with a Cu film 89 with a barrier film 88 being interposed therebetween, thereby forming a Cu interconnect.

Note that the design feature of the gate electrode portion 77 is in the shape of a rectangle. In the exposure step of FIG. 7C, however, the feature is, for example, deformed due to exposure. Therefore, deformation is precomputed, and the mask 75 having a complicated feature different from the design feature is used to compensate for the precomputed deformation. As an example, the width of a line gradually increases toward a terminal thereof.

Similarly, in the exposure step of FIG. 8C, in order to obtain the contact hole 84 having a desired shape, a feature deformation due to exposure etc. is precomputed, and the mask 83 having a complicated feature is used to compensate for the feature deformation. An example of the complicated feature is the dummy feature 11 of FIG. 6B.

Optical proximity correction (OPC) is a computation process of obtaining a shape which compensates for deformation which would occur. It takes a considerably long time to perform the OPC process in order to obtain an exposure mask feature from a design feature. Therefore, in the optical proximity correction method of the present disclosure, the OPC process is performed every time a circuit portion layout which is involved in the operation of a semiconductor device is designed, and an OPC-corrected dummy cell layout is used for dummy cells which are not involved in the operation. As a result, while a high-accuracy OPC process is applied to the entire layout of a semiconductor device, the time required for the OPC process can be reduced.

As described above, according to the semiconductor device, the semiconductor fabrication mask, and the optical proximity correction method of the present disclosure, high-accuracy optical proximity correction can be quickly applied to the entire layout. Therefore, the present disclosure is useful for reducing cost while maintaining processing accuracy.

What is claimed is:

1. A semiconductor device comprising:
   a circuit portion including a plurality of features spaced apart from each other by a first distance for which optical proximity correction is required; and
   a plurality of dummy feature groups each including a plurality of dummy features spaced apart from each other by a second distance for which optical proximity correction is required, wherein
   the plurality of features and the plurality of dummy features are formed in a first layer,
   at least one feature of the plurality of features included in the circuit portion is a real feature,
   a first dummy feature group of the plurality of dummy feature groups has a first dummy feature,
   a second dummy feature group of the plurality of dummy feature groups has a second dummy feature and is adjacent to the first dummy feature group,
   a third dummy feature group of the plurality of dummy feature groups has a third dummy feature and is adjacent to the circuit portion,
   the first dummy feature is adjacent to the second dummy feature with a third distance for which optical proximity correction is not required, and
   the third dummy feature is adjacent to the real feature with a fourth distance for which optical proximity correction is not required.

2. The semiconductor device of claim 1, wherein the third distance and fourth distance are larger than or equal to a light source wavelength/a lens numerical aperture of a device for exposing the plurality of dummy feature groups.

3. The semiconductor device of claim 1, wherein
   the at least one real feature includes a gate electrode, and
   the plurality of dummy feature groups include a plurality of the dummy features which have a linear shape and extend in parallel with each other.

4. The semiconductor device of claim 3, wherein of the plurality of dummy features extending in parallel with each other, an outermost dummy feature or features have a width larger than that of an inner dummy feature or features.

5. The semiconductor device of claim 3, wherein the plurality of dummy feature groups include the dummy features coupled to each other in the first layer.

6. The semiconductor device of claim 1, wherein
   the plurality of dummy feature groups include an array of the dummy features arranged in at least two directions, each of the dummy features having a width and a length, where the ratio of the width to the length is 1:20 or less, and
   an outer peripheral portion of the array includes the dummy feature or features having a width larger than that of the dummy feature or features located farther inside the array.

7. The semiconductor device of claim 1, wherein
   the plurality of dummy feature groups include an array of the dummy features arranged in at least two directions, each of the dummy features having a width and a length, where the ratio of the width to the length is 1:20 or less, and
   an outer peripheral portion of the array includes the dummy feature or features coupled to the dummy feature or features located farther inside the array.

8. The semiconductor device of claim 1, wherein
   the at least one real feature includes a contact hole, and the plurality of dummy feature groups include the dummy feature or features in the shape of a hole.

9. The semiconductor device of claim 1, wherein the plurality of dummy feature groups are each in the shape of a square with a side of 4 μm or more and 10 μm or less.

10. A mask for semiconductor fabrication comprising:
a circuit mask feature including a plurality of mask features spaced apart from each other by a first distance for which optical proximity correction is required; and
a plurality of dummy mask feature groups each including a plurality of dummy mask features spaced apart from each other by a second distance for which optical proximity correction is required, wherein
at least one mask feature of the plurality of mask features included in the circuit mask feature is a real mask feature,
a first dummy mask feature group of the plurality of dummy mask feature groups has a first dummy mask feature,
a second dummy mask feature group of the plurality of dummy mask feature groups has a second dummy mask feature and is adjacent to the first dummy mask feature group,
a third dummy mask feature group of the plurality of dummy mask feature groups has a third dummy mask feature and is adjacent to the circuit mask feature,
the first dummy mask feature is adjacent to the second dummy mask feature with a third distance for which optical proximity correction is not required, and
the third dummy mask feature is adjacent to the real mask feature with a fourth distance for which optical proximity correction is not required.

11. The mask of claim 10, wherein the third distance and fourth distance are larger than or equal to a reduction projection factor×a light source wavelength/a lens numerical aperture of a device for exposing the plurality of dummy mask feature groups.

12. The mask of claim 10, wherein
the at least one real mask feature includes a mask feature corresponding to a gate electrode, and
the plurality of dummy mask feature groups include a plurality of the dummy mask features which have a linear shape and extend in parallel with each other.

13. The mask of claim 12, wherein of the plurality of dummy mask features extending in parallel with each other, an outermost dummy mask feature or features have a width larger than that of an inner dummy mask feature or features.

14. The mask of claim 12, wherein the plurality of dummy mask feature groups include the dummy mask features coupled to each other.

15. The mask of claim 10, wherein
the plurality of dummy mask feature groups include an array of the dummy mask features arranged in at least two directions, each of the dummy mask features having a width and a length, where the ratio of the width to the length is 1:20 or less, and
an outer peripheral portion of the array includes the dummy mask feature or features having a width larger than that of the dummy mask feature or features located farther inside the array.

16. The mask of claim 10, wherein
the plurality of dummy mask feature groups include an array of the dummy mask features arranged in at least two directions, each of the dummy mask features having a width and a length, where the ratio of the width to the length is 1:20 or less, and
an outer peripheral portion of the array includes the dummy mask feature or features coupled to the dummy mask feature or features located farther inside the array.

17. The mask of claim 10, wherein
the at least one real mask feature includes a mask feature corresponding a contact hole, and
the plurality of dummy mask feature groups include the dummy mask feature or features corresponding to a feature in the shape of a hole.

18. The mask of claim 10, wherein the plurality of dummy mask feature groups are each in the shape of a square with a side of 4 μm or more and 10 μm or less.

19. A method for optical proximity correction comprising the steps of:
(a) forming a circuit layout corresponding to a circuit portion including a plurality of features spaced apart from each other by a first distance for which optical proximity correction is required;
(b) applying optical proximity correction to the circuit portion;
(c) preparing a dummy layout corresponding to a plurality of optical proximity corrected dummy feature groups each including a plurality of dummy features spaced apart from each other by a second distance for which optical proximity correction is required; and
(d) arranging at least one of the circuit layouts and a plurality of the dummy layouts,
wherein in step (d), the plurality of dummy feature groups are adjacent to each other and spaced apart from each other by a third distance for which optical proximity correction is not required, and the circuit portion and the plurality of dummy feature groups adjacent to the circuit portion are spaced apart from each other by the third distance.

20. The method of claim 19, wherein the third distance is larger than or equal to a light source wavelength/a lens numerical aperture of a device for exposing the plurality of dummy feature groups.

* * * * *